United States Patent [19]

Weil et al.

[11] Patent Number: 4,722,907
[45] Date of Patent: Feb. 2, 1988

[54] METHOD OF FORMING AN AVALANCHE SEMICONDUCTOR PHOTO-DETECTOR DEVICE AND A DEVICE THUS FORMED

[75] Inventors: Thierry Weil; Borge Vinter, both of Paris, France

[73] Assignee: Thomson-CSF, Paris, France

[21] Appl. No.: 871,970

[22] Filed: Jun. 9, 1986

[30] Foreign Application Priority Data

Jun. 18, 1985 [FR] France .................................. 85 09243

[51] Int. Cl.[4] .................... H01L 29/167; H01L 27/14; H01L 29/90
[52] U.S. Cl. ........................................ 437/3; 437/126; 437/128; 437/133; 437/143; 437/184; 437/969; 357/30
[58] Field of Search ............................. 357/30, 16, 13; 29/569 L, 572, 576 E; 148/1.5

[56] References Cited

U.S. PATENT DOCUMENTS

| | | | |
|---|---|---|---|
| 4,194,935 | 3/1980 | Dingle et al. | 148/174 |
| 4,250,516 | 2/1981 | Worlock | 357/16 |
| 4,442,444 | 4/1984 | Osaka | 357/30 |
| 4,476,477 | 10/1984 | Capasso et al. | 357/30 |
| 4,486,765 | 12/1984 | Capasso | 357/30 |
| 4,546,480 | 10/1985 | Burnham et al. | 357/16 |
| 4,591,889 | 5/1986 | Gossard et al. | 357/16 |
| 4,620,206 | 10/1986 | Ohta et al. | 357/4 |
| 4,620,214 | 10/1986 | Margalit et al. | 357/13 |

FOREIGN PATENT DOCUMENTS

131437 1/1985 European Pat. Off. .
2107927 5/1983 United Kingdom .

OTHER PUBLICATIONS

F. Capasso, et al., "Pseudo-Quaternary GaInAsP Semiconductors: A New $Ga_{0.47}In_{0.53}As/InP$ Graded Gap Superlattice and Its Applications to Avalance Photodiodes," *Applied Physics Letters*, 45 (11) Dec. 1, 1984, pp. 1193-1195.

F. Capasso, "Multilayer Avalanche Photodiodes and Solid-State Photomultipliers," *Lasers Focus/Electro-Optics*, Jul. 20, 1984, No. 7, pp. 84, 86, 88, 90, 92, 94, 96, 98, 100 and 101.

*Primary Examiner*—Brian E. Hearn
*Assistant Examiner*—Chi Tso Huang
*Attorney, Agent, or Firm*—Pollock, Vande Sande & Priddy

[57] ABSTRACT

An avalanche photodetector of the heterojunction type comprises an intermediate region between two end regions made from distinct semiconductor materials. The intermediate region comprises a lattice of slices of varying thicknesses of alternating layers of the material of the end regions thus forming a system of coupled quantum wells whose thicknesses and whose number of slices are determined so that the response time of the photodetector is less than a maximum given time, while maintaining the number of coupled quantum wells to a minimum.

6 Claims, 6 Drawing Figures

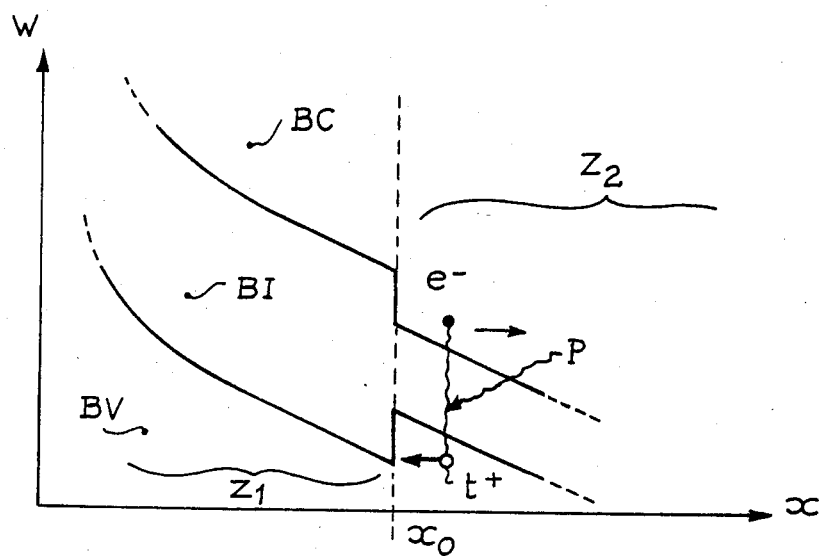
PRIOR ART Fig.1
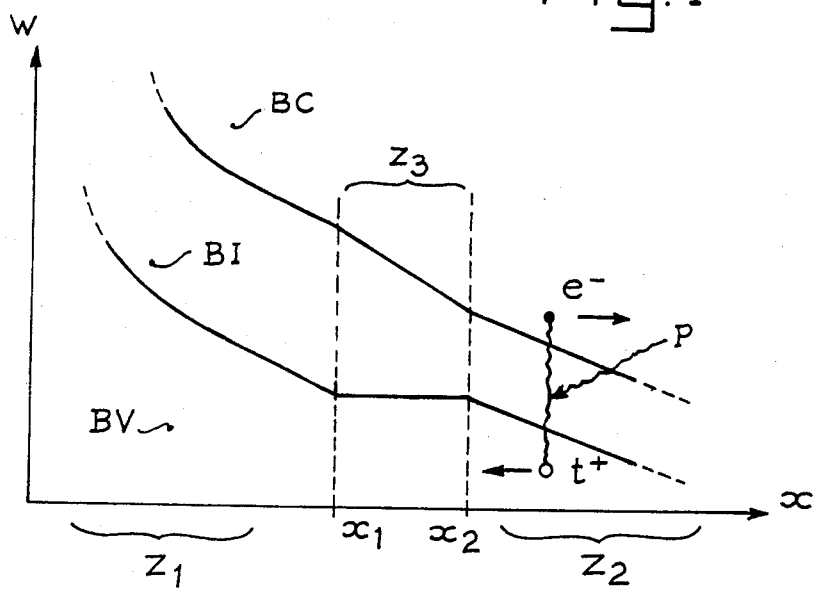
PRIOR ART Fig.2

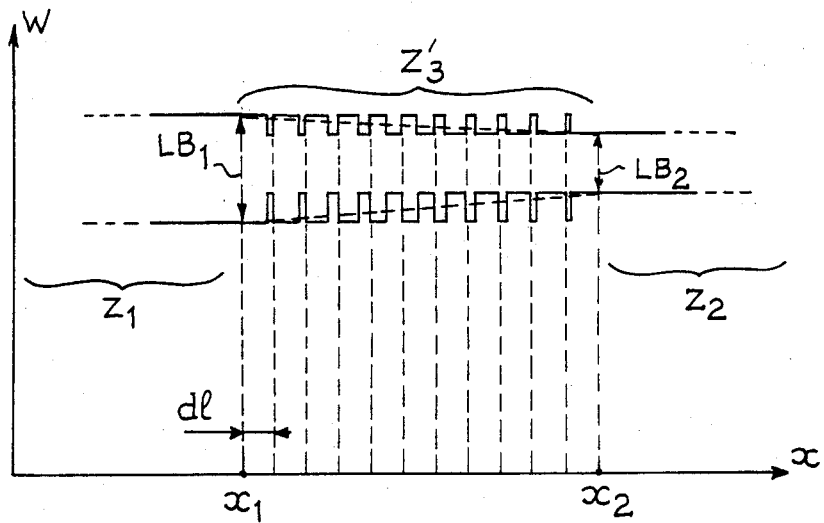
PRIOR ART Fig.3
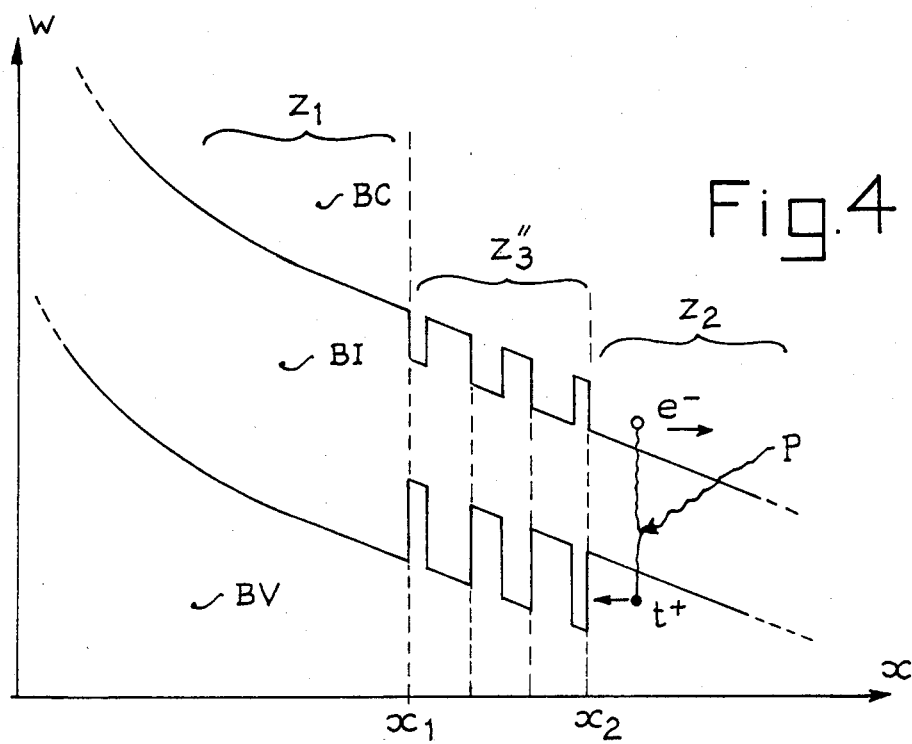
Fig.4

METHOD OF FORMING AN AVALANCHE SEMICONDUCTOR PHOTO-DETECTOR DEVICE AND A DEVICE THUS FORMED

BACKGROUND OF THE INVENTION

1. Field of the Invention

The present invention relates to a method of forming an avalanche semiconductor photodetector device of the type with separate absorption and multiplication zones.

2. Description of the Prior Art

For increasing the performances of avalanche photodetectors, (reduction of the noise) heterostructures are conventionally used.

The absorption takes place mainly in the material with narrow prohibited band width and multiplication in material with wide prohibited band width. In such a device, carriers, for example holes, may be stored temporarily by the potential barrier of the heterojunction, leading to response times which are too high, typically of a few tens of nanoseconds for a device with a junction of Indium-Gallium-Arsenic/Indium-Phosphorous (InGaAs/InP). structure.

In a second approach of the prior art, this problem may be solved by replacing the heterojunction by a region of variable prohibited band width. Easy to realize in the case of the junction system of the Gallium-Arsenic/Aluminium-Gallium-Arsenic (GaAs/AlGaAs) type, such a variation is technically very difficult to accomplish without introducing mesh detuning in a system such as the junctions of the Indium-Gallium-Arsenic/Indium-Phosphorous (InGaAs/InP) type. That is due among other things to the difficulties in mastering the exact composition of the intermediate quaternary compound.

In a third approach of the prior art, the response time may also be reduced by replacing the abrupt heterojunction by a succession of thin layers of the two end compounds, Indium-Phosphorous and Indium-Gallium-Arsenic for example.

Such a method was described in the article by CAPASSO et al.: "Pseudo-quaternary GaInAsP semiconductors: A new $Ga_{0.47}In_{0.53}As/InP$ graded gap superlattice and its applications to avalanche photodiodes" published in the US review: "Applied Physics Letters", vol. 46, No. 11, 1st Dec. 1984, pages 1193-1195.

The result sought is to produce a "pseudo-quaternary alloy" which has the same mean local potential characteristics as an alloy of variable composition in the second approach of the prior art. A constant mesh length is imposed on the system. The mesh is formed by a well and the potential barrier which follows it. That leads to considering systems with very numerous wells, typically twenty or so.

This method therefore does not allow optimized avalanche photodetectors to be obtained. The high number of semiconductor "slices" to be formed leads to manufacturing difficulties.

The purpose of the invention is to provide a method of forming avalanche semiconductor photodetector devices palliating the disadvantages of the prior art.

The structure of the invention comprises, as in the case of the third approach of the prior art, a lattice of layers of alternate semiconductor materials.

However, the starting approach is different, which allows, for a comparable operating speed characteristic, the number of alternate layers to be appreciably reduced, that is to say the structure of these layers and therefore the structure of the detector to be optimized.

In addition to the manufacturing economies obtained, by reducing the number of interfaces, the quality of the device is improved since each interface generates defects.

SUMMARY OF THE INVENTION

The invention provides a method of forming an avalanche photodetector of the type comprising at least one photon absorption region, in which carriers are photoinduced, made from a first semiconductor material with a narrow prohibited band width a carrier multiplication region, made from a second semiconductor material with a wide prohibited band width, and a third intermediate region, formed by a lattice of slices of alternate layers of the first and second materials forming a system of a coupled quantum well separated by potential barriers; comprising, with the photodetector specified for operating conditions comprising a given band discontinuity and local electric field as well as a maximum response time, a phase for determining said intermediate region comprising a minimum number of slices of variable thickness alternating layers ensuring a response time less than or equal to said maximum response time, said phase comprising:

a step for determining the respective thicknesses of the layers of first and second semiconductor materials forming said slices of the intermediate region of a system comprising a single quantum well ensuring a minimum intermediate response time of said system;

a step for comparing this minimum intermediate response time with said maximum response time;

and the conditional repetition of the determination and comparison steps by progressively increasing the number of coupled wells until the response time obtained for a system comprising a given number of coupled quantum wells is less than said maximum response time or until the response time for this system comprising said given number of coupled quantum wells is greater than or equal to the response time for a system comprising a number of coupled wells less than unity.

The invention also provides a photodetector device obtained by such a process.

BRIEF DESCRIPTION OF THE DRAWINGS

The invention will be better understood and other features and advantages will be clear from reading the following description with reference to the accompanying Figures in which:

FIG. 1 illustrates the band diagram in the vicinity of the heterojunction of an avalanche photodiode with separate absorption and multiplication, according to a first approach of the prior art;

FIG. 2 illustrates the band diagram of a photodiode with separate absorption and multiplication zones in which the abrupt heterojunction is replaced by a variable composition and variable prohibited band structure, in a second approach of the prior art;

FIG. 3 illustrates the band diagram of a photodiode with absorption and multiplication zones separated by alternating layers of the materials of the absorption and multiplication zones in a third approach of the prior art;

FIG. 4 illustrates the band diagram of a photodiode of the invention;

DESCRIPTION OF THE PREFERRED EMBODIMENTS

Figure 5:
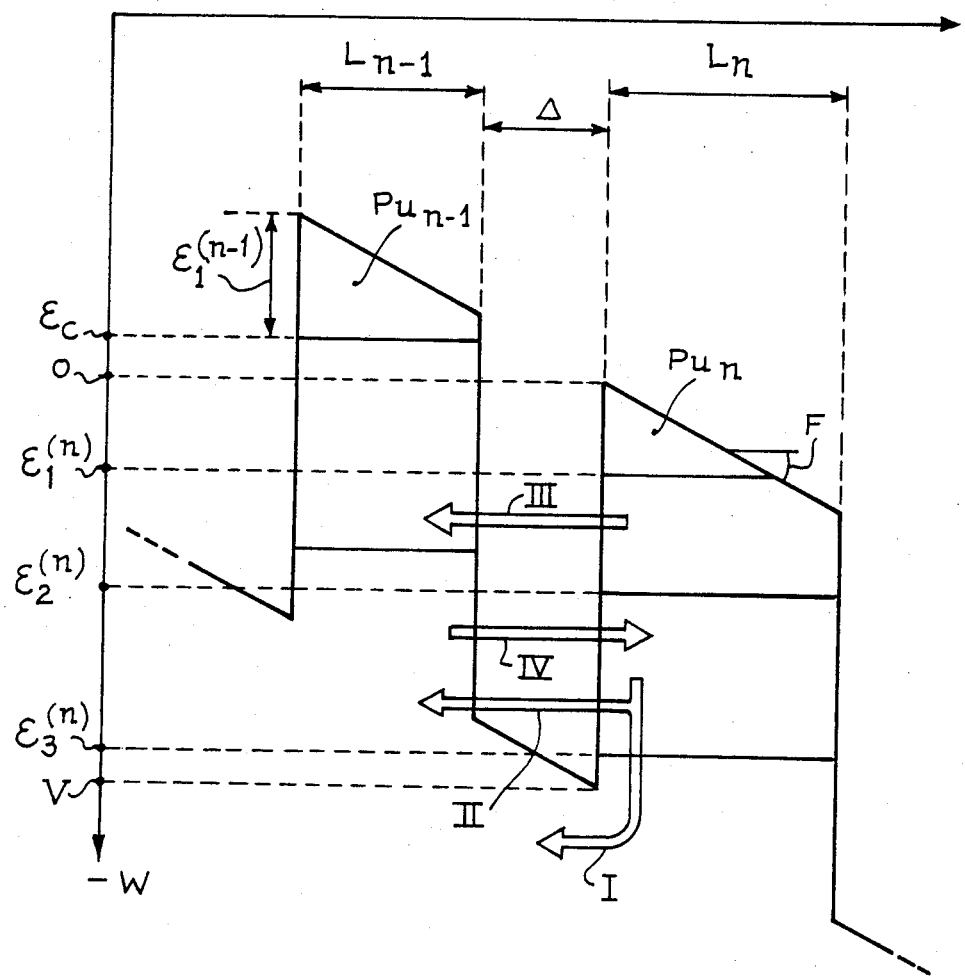
FIG. 5 illustrates a detail of the valence band diagram of such a diode.

FIG. 1 illustrates schematically the band diagram in the vicinity of a junction of the heterojunction of an avalanche photodiode with separate absorption and multiplication zones, in a first approach of the prior art, as well as the mechanism for generating an electron-hole pair by photon collection in the absorption zone.

The vertical axis of the diagram represents energy levels and the horizontal axis arbitrary distances with respect to abscissa $x_0$ of the interface between the two zones $Z_1$ and $Z_2$.

Zone $Z_2$ is made from a material with a narrow prohibited band width. This zone $Z_2$ is a zone for absorbing the photons p reaching the junction.

Zone $Z_1$ made from a material with a larger prohibited band width is a zone for multiplying the carriers by avalanche.

Photons p of energy h $\nu$ create "electron $e^-$—hole $t^+$" pairs. The value h is PLANCK's constant and $\nu$ the frequency of the absorbed photon. The holes will be driven from the absorption zone $Z_2$ to the multiplication zone $Z_1$ by avalanche under the influence of the electric field reigning in the junctions. However, because of the potential value present at the interface, the carriers created may be "trapped" at this level and stored temporarily. The diffusion process is therefore slowed down.

To overcome this drawback, it has been proposed in a second approach of the prior art to dispose a semiconductor material of variable composition between the two absorption and avalanche zones $Z_1$ and $Z_2$. The purpose is to provide a transition with continuous variation between the two end zones. For this, the composition of the material is continuously variable between these two zones. The same is true insofar as the width of the prohibited band is concerned.

FIG. 2 illustrates such an arrangement.

The band diagram comprises a third zone $Z_3$ of thickness $(x_2-x_1)$, $x_1$ and $x_2$ representing the abscissa of the boundaries of the end zones $Z_1$ and $Z_2$.

The intermediate zone $Z_3$ provides theoretically a perfectly graduated transition between the end zones. The trapping effect is avoided if the product of the length of the transition zone $x_2-x_1$ multiplied by the gradient of the electrostatic potential energy F is greater than the potential discontinuity V of the valence band $[(x_2-x_1) F>V]$. The method of the invention which will be described subsequently is not subjected to this restriction.

However, the material of this intermediate zone $Z_3$ is an alloy, in variable proportions, of the end materials. They are of course crystalline materials. Therefore this variable composition must be lattice parameter matched with the two end materials.

As was recalled above, this requirement may be satisfied for certain types of materials. For example, the requirement which has just been mentioned may apply to heterojunctions of Gallium-Arsenic/ALuminum-Gallium-Arsenic (GaAs/AlGaAs) structure. For other heterojunction structures, the composition variation is technically very difficult to obtain, even practically impossible.

This is the case for example for a heterojunction of the Indium-Gallium-Arsenic/Indium-Phosphorous (InGaAs/InP) type.

Therefore, a "pseudo-quaternary" alloy has been proposed. For this, between the end zones, instead of a layer of material of continuously variable composition, a lattice of layers is used all layers of constant thickness. Each layer is in actual fact formed of two separate sublayers: a first sublayer made from the material of one of the two end zones and a second sublayer made from the material of the other end zone. The thickness of these subzones is variable and equal to the thickness of a few atomic layers. With this method, the numbers of atomic layers in each of the sublayers are determined so as to simulate, from one layer to another, a mean band width variation approximating the continuous variation obtained by a variable composition of the intermediate zone $Z_3$, in the second approach of the prior art.

Such a method is described in the above mentioned article by CAPASSO et al.

FIG. 3 illustrates the trend of the band diagram of the intermediate zone $Z'_3$. This zone is formed by a stack of slices of materials, of constant thickness d1, each formed from the succession of a certain number of atomic layers of the material of zone $Z_1$ and then of the material of zone $Z_2$. In FIG. 3, the number of atomic layers of the material of zone $Z_1$ of a slice decreases progressively from the left (abscissa $x_1$, limit of zone $Z_1$) towards the right (abscissa $x_2$, limit of zone $Z_2$) and the number of atomic layers of the material of zone $Z_2$ increases correspondingly. The mean prohibited band width varies then from one slice to another so as to pass progressively from value $LB_1$, prohibited band width of the material of zone $Z_1$, to the value of $LB_2$, width of the prohibited band of the material of zone $Z_2$.

This method does not however allow an optimized structure to be obtained for it is necessary, in order to obtain the desired matching between the prohibited band widths, to create a large number of intermediate interfaces. In addition, this method assumes that the carriers behave as if they were only sensitive to the mean prohibited band width in a layer. The method of the invention described hereafter is independent of the validity of such an assumption.

Besides the manufacturing difficulties related to the increase of the number of interfaces, it should be noted that the quality of the device risks being degraded for each interface generates defects.

The invention relates to avalanche photodetectors also comprising an intermediate zone formed by a lattice of alternating layers of materials of the end zones for absorption and multiplication of the carriers by avalanche.

However, the invention starts from a different approach in which it is not sought to match the band widths. While keeping the advantages of the photodetectors of the type which has just been recalled, particularly the speed, the number of interfaces required may be significantly reduced and so the structure of the avalanche photodetector optimized.

The physical phenomena coming into play will be recalled first of all.

FIG. 4 illustrates schematically a band structure of a device of the invention.

Each slice also comprises, as in the case of a prior art device as shown in FIG. 3, a layer of materials of zone $Z_1$ and a layer of materials of zone $Z_2$. However, the thickness of these slices as well as the thickness of the layers are variable. These thicknesses are determined by the method of the invention which will be explained hereafter. The same goes for the total number of slices. The assembly forms a coupled quantum well system separated by potential barriers.

FIG. 5 illustrates an enlarged portion of the valence band diagram of the intermediate zone $Z''_3$.

The free carriers trapped by the potential barriers of the interfaces may cross thereover in several ways:
 thermoemissive effect,
 tunnel effect;
 "hopping" that is to say jumping assisted by phonons or by interactions with impurities;
 etc . . .

FIG. 5 illustrates these mechanisms.

Let $j_n^\uparrow$ be, for a well of arbitrary index n, the flow of carriers towards the continuum in the direction of the material with wide prohibited band (FIG. 4: zone $Z_1$) per particle trapped in the well of index n. This flow comes from the thermoemissive effect (reference I in FIG. 5) or the tunnel effect (reference II) through the top of the potential barrier between the well of index n and the adjacent coupled well of index n−1.

We will call $j_n^\leftarrow$ the flow (reference III) towards the adjacent well of index n−1 per particle trapped in the well of index n, due to the tunnel effect usually assisted by phonons or impurities.

Let $j_{n-1}^\rightarrow$ be the flow towards the well of index n, per particle trapped in the well of index n−1 (reference IV).

The relative importance of these different methods of escape depends on a large number of parameters, particularly on the temperature of the carriers, on the dimensions of the zone in which they are confined, on the height and thickness of the barriers to be crossed and on the electric field applied.

As a function of all these parameters, the escape time in a structure such as the one shown in FIG. 5 may be evaluated.

More precisely, for each of these wells, the mean flow per particle from this well towards the continuum, $j_n^\uparrow$ may be calculated the flow per particle towards the neighboring well on the left when it exists, $j_n^\leftarrow$, and towards the right hand neighboring well $j_n^\rightarrow$. The absorption region $Z_2$ is considered as a (N+1)th well of infinite length, the total number of wells being equal to N.

The number of carriers $\nu_n$ trapped in the well of index n proves the differential equation:

$$\frac{d\nu_n}{dt} = -\sum_{m=1}^{N+1} J_{n,m} \nu_m(t) \qquad (1)$$

with $1 \leq n \leq N+1$ in which equation:

$$J_{n+1,n} = -j_n^\rightarrow; \quad J_{n-1,n} = -j_n^\leftarrow \text{ and } J_{n,n} = j_n^\uparrow + j_n^\rightarrow + j_n^\leftarrow$$

the other coefficients of the lattice associated with this equation being zero.

The lattice J is defined positive and the smallest of its proper values $\lambda_1$ gives the inverse of the response time of the system.

From the knowledge of the coefficients $j_n$, the response time of a coupled well system such as shown in FIG. 4 may therefore be determined.

The determination of the coefficients $j_n$ will now be explained.

If we consider that one particle out of two is emitted towards the material of wide prohibited band region $Z_1$, it can be shown that the flow $j_n^\uparrow$ obeys the relationship:

$$j_n^\uparrow = \frac{2kT}{h} \exp - \left( \frac{V - \epsilon^{(n)}}{kT} \right) \qquad (2)$$

for electric fields of a few tens of kilovolts per centimeter; in which relationship:
 T is the temperature in degrees Kelvin;
 V is the band discontinuity as illustrated in FIG. 5;
 $\epsilon^{(n)}$ is the energy of the first linked level counted from the bottom of the potential band as illustrated in FIG. 5,
 k and h are respectively BOLTZMANN and PLANCK's constants.

$j_n^\leftarrow$ may be evaluated by taking into account the expression of the wave functions in the wells n and (n−1), calculated as if these wells were isolated, and from the Hamiltonian function of interaction with the phonons.

A rougher estimate consists in considering that the transfer probability is the same as if the well of index (n−1) was of infinite length for the states whose energy is greater than the lowest energy level of well (n−1) and that it is zero in the other cases.

Therefore obeys the relationship:

$$j_n = \rho_0 k T \sum_i \text{Max}\left(1, \frac{FL_n}{\epsilon_i}\right) \frac{\sqrt{\epsilon_i}}{\sqrt{2m^*L}} \theta° \left(\frac{2\epsilon_i}{V} - 1\right) F(\epsilon_i, \epsilon_c)$$

in which:

$$F(\epsilon_i, \epsilon_c) = \left[ \exp\frac{V_{\epsilon i}}{kT} - \beta\sqrt{V - \epsilon_i} - \text{Min}\left(0, \frac{\epsilon_c - \epsilon_i}{kT}\right) \right] \quad (3)$$

$$\rho_0 = 4\pi\frac{m^* S}{h^2}$$

is the two dimensional state density;
 m* is the effective mass;
 S is the area of the sample;
 $L_n$ is the width of the well n: $Pu_n$;
 F is the electric potential energy gradient as illustrated in FIG. 5.

The sum $\Sigma_i$ leads, at all the levels of the well, to solutions of the Hamiltonian function with an energy dimension $\epsilon_i$ less than the discontinuity V of the valence bands of the two materials:

$$\theta^\circ(x) = 2\frac{1 - x^2}{1 + 3x^2}$$

is a geometrical factor of transparency of the barrier between 0 and 2;

$$\beta = 4\pi\frac{\sqrt{2m^* \Delta}}{h}$$

where $\Delta$ is the thickness of the barrier of index (n−1); and $\epsilon_c = \epsilon_1(L_{n-1}, F) - F \cdot (\omega_{n-1} + \Delta)$ where $\epsilon_1(L_{n-1}, F)$ is the first level of the well of index n−1: $Pu_{n-1}$, whose thickness $L_{n-1}$ $\epsilon_c$ is the critical energy short of which this simplified model assumes that the barrier reflects the particles.

The coefficient $j_{\vec{n}}$ may be assessed in a similar way.

Conversely, if the limit response time is imposed, a system of coupled quantum wells may then be found guaranteeing a response time less than this imposed limit response time.

This is the case in general. In fact, a heterojunction avalanche photodetector device of the prior art, for which a set of geometrical, physical, electrical, etc., characteristics is imposed, is characterized by a given response time.

The invention provides a method for forming an avalanche photodetector guaranteeing a response time less than this response time, while requiring only a minimum number of coupled wells.

A general variant of the method of the invention will first of all be described. In what follows, a simplified variant of the method will also be described.

It is assumed that the band discontinuity and the local electric field set by the operating conditions of the device are known.

Let $t_0^{**}$ be the response time of the abrupt heterojunction.

Let $t_1(a, \delta)$ be the response time of a system in which have been inserted between the two end materials a well of a atomic layers of the narrow prohibited band material and a barrier of $\delta$ atomic layers of the wide prohibited band material. For a given a, $t_1(a, \delta)$ is a convex trend function which supposes a minimum $t_1^*(a)$ for a barrier thickness of $\delta^*(a)$ layers. This minimum is determined in a finite number of operations. Similarly, the function $t_1^*(a)$ supposes a minimum $t_1^{**}$ for $a = a_1^*$.

$t_1^{**}$, which is the response time of a system comprising a well of $a_1^*$ layers and a barrier of $\delta_1^*$ ($n_1$) atomic layers, is the best time which may be obtained with a single intermediate quantum well.

Similarly, $t_2^{}, t_3^{}, \ldots t_n^{**}$, etc. may be determined.

In general, $t_n^{}$ is the time of the best system with n intermediate wells. The succession of the times $t_n^{}$ begins by decreasing and remains decreased in general for a fairly long time, until a limit $t^{***}$ where a new intermediate well brings no further gain in time.

If $t_R$ is the response time fixed for a photodetector device to be optimized, three situations may be envisaged of which two are limit situations.

The two limit situations are:

(a) if $t_R$ is greater than $t_0^{**}$ an abrupt heterojunction device is suitable and the method of the invention finds no advantageous application in this case.

(b) if $t_R$ is less than $t^{***}$, it is not possible to reach the required time with a system of coupled quantum wells under the operating conditions of the considered device. These conditions may naturally be modified for increasing the local electric field or for increasing the temperature.

Finally, in the general case in which the method of the invention finds its whole application, the number of wells n is determined such that the relationship $t_{n-1}^{} > t_R > t_n^{}$ is proved, either by using the values $t_1^{}$ to $t^{*}$ if they are known, or by determining them one by one until the above inequality is proved. It is a question then in this latter case of an iterative process.

The variant of the method of the invention which has just been described is the most general variant and guarantees the best possible avalanche photodetector structure, that is to say an optimized construction comprising the minimum of coupled wells. This offers the advantage of easier manufacturing and of limiting the risk of the appearance of defects by minimizing the number of interfaces.

This variant of the method however proves generally fairly long to put into pratice.

For some applications, accepting certain simplifying assumptions, which will be explained in what follows, a variant of the method of the invention can be obtained which is more rapid to put into practice.

For this variant systems are considered which will be called "thermalized", for which the crossing times of the barriers in the direction of the overall current ($1/j_{\vec{n}}$) must all be less than a fraction of the desired response time $t_R$. This fraction may be chosen typically equal to 20% of the time for the systems comprising half a dozen wells and equal to 10% if the wells are more numerous. It is then sufficient for the thermoemissive flow $j\uparrow$ of the first well to create a sufficient leak current, typically the condition $(1/j\uparrow) < (t_R/2)$ is suitable, for the leak system to behave like a set of communicating vessels. This is the interest of the "thermalization" condition, so that the carriers escape with a characteristic time $t_R$.

The systems are therefore caused to be "with increasing energy levels". That is to say that the first level of the well of index (n+1) must have an energy greater than that of the well n. In other words, the reduction of localization energy due to the greater thickness of the well of index (n+1) must be less than the potential energy increase due to the electric field. It is often desirable for the difference between the first successive levels to be at least 1 meV so as to avoid the phenomenon of resonance of the levels.

This condition prevents the appearance in a well of a non zero state density below the first calculated level as if the well were isolated from the well situated at its right. Thus the system of "left to right" wells may be constructed without having to make an overall assessment of the response time. Under these conditions, the flight time of a particle trapped in the well of the index n only depends on the thickness of the well n, on the width of the barrier of index (n−1) and, in a much less sensitive way, if the condition of the increasing level is achieved, on the width of the well of index (n−1).

A good "thermalized" structure with increasing energy levels leading to a response time less than the required time $t_R$ may be determined in a way which will now be described. The escape time to the wide prohibited band material of a particle trapped in the first well increases with the width thereof, and so, during an initial step, the largest width compatible with the required time $t_R$ is determined by taking for example as criterion $(1/j\uparrow^n_1) < (t_R/2)$. If the required time is longer than the response time of an abrupt heterojunction, it is obviously pointless in constructing intermediate barriers.

Then the procedure is iterative.

It is assumed that the structure is known up to the nth well. Then the thicknesses of the (n+1)th barriers and wells are determined. As a first approximation, the stay time of a barrier in the (n+1)th well increases with the thickness thereof and often tends to decrease with that of the barrier. The combination of thicknesses compatible with the required time is sought so as to have the thickest well.

Three cases may arise:

(a) it is possible to have a (n+1)th well of infinite length. The procedure is then finished: the transition has been achieved with the narrow prohibited band material.

(b) the largest well compatible with the required time is thicker than the preceding well. The iterative procedure continues.

(c) it is not possible to obtain the required time with a well thicker than the preceding one: the required time is too short. Either the whole of the device may be modified so as to increase the strength of the electric field, which reduces the response times, or it may possibly be ignored if the particles trapped in this particular well are not very numerous relative to the rest of the device.

In some situations, the choice remains open between several possible combinations of thicknesses for the same number of coupled wells. It is then possible either to make an arbitrary choice, or to use the general calculation method described in the general variant of the method of the invention for determining the most optimized structure among the possible structures taking into account the imposed response time.

As an example, using the method of the invention in its second variant, an avalanche photodiode has been produced which may operate at 2 GHz. That corresponds to a response time $t_R$ less than or equal to 250 ps.

The materials of the end regions $Z_1$ and $Z_2$ were respectively Indium-Phosphorous (InP) and Indium-Gallium-Arsenic (InGaAs).

The other fixed parameters were the following:
valence band discontinuity: 350 meV;
local electric field: 100 kVcm$^{-1}$.

Under these conditions, an abrupt heterojunction avalanche photodiode is characterized by a response time of the order of 200 ns, and a maximum frequency of 30 MHz.

The intermediate zone $Z''_3$ defined in conformity with the method of the invention must comprise five coupled quantum wells, the end zone $Z_2$ being considered as a sixth well of infinite thickness.

Figure 6:
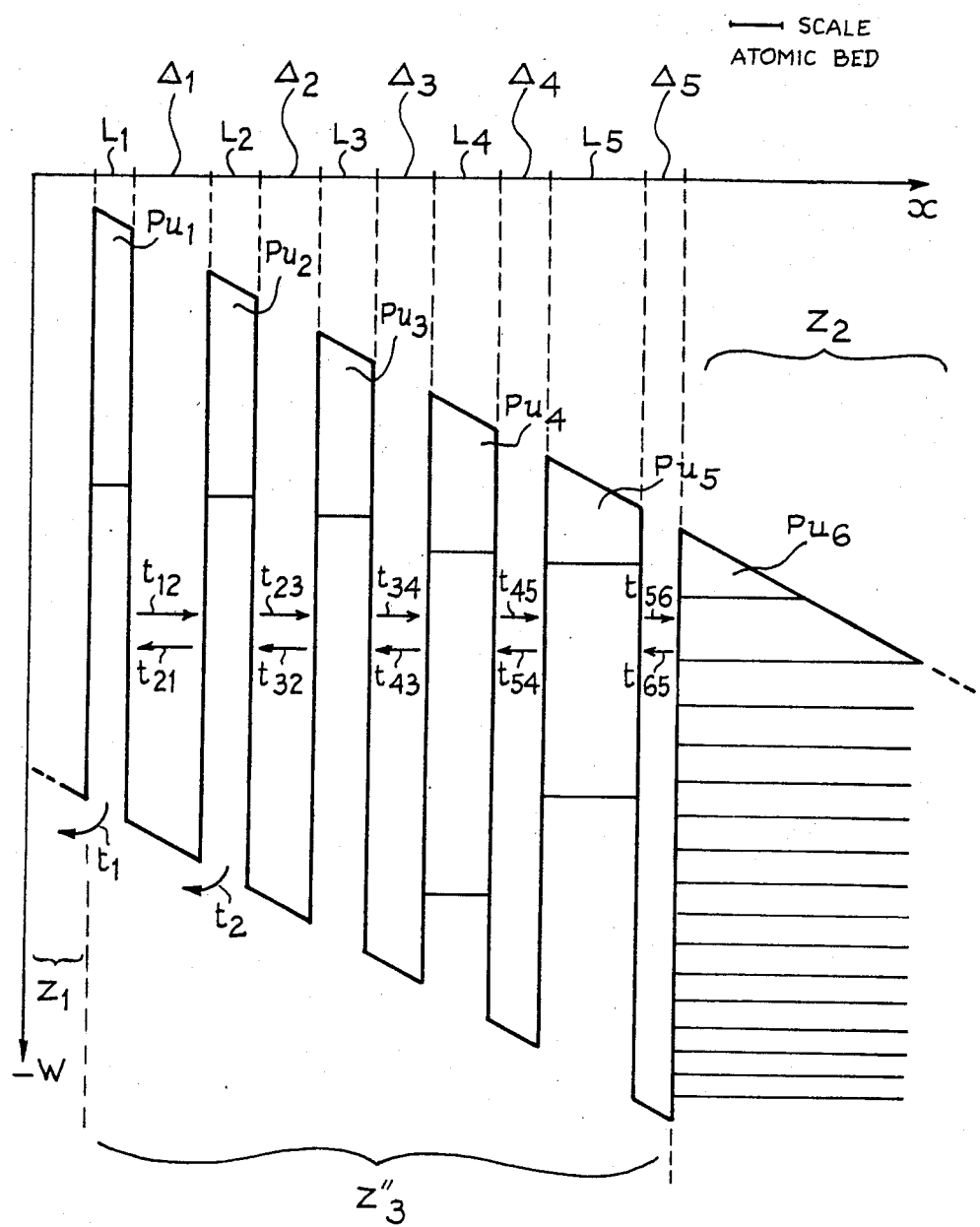
FIG. 6 illustrates a valence band diagram of a photodiode of the invention for a particular embodiment.

FIG. 6 illustrates schematically the valence band diagram of the avalanche photodiode thus formed.

The lengths $L_1$ to $L_5$ represent the thicknesses of the different wells expressed in a number of atomic layers, as shown on the scale associated with the horizontal axis.

The lengths $\Delta_1$ to $\Delta_5$ represent the thicknesses of the different potential barriers also expressed as a number of atomic layers.

An atomic layer has a thickness of 2.9347 Å.

The time pairs $t_{12}$, $t_{21}$ to $t_{56}$, $t_{65}$ represent the transfer times from well to well (well $Pu_1$ to $Pu_6$). These times correspond to the inverses of the previously described parameters $j\uparrow_{\bar{n}}$ and $j\downarrow_{\bar{n}}$.

The numerical values of these parameters are shown in table I placed at the end of the present description.

It can be seen from this table that the total thickness of the slices of composite materials (thickness of the wells plus thickness of the potential barriers) is not constant.

The times $t_1$ and $t_2$ have also been shown which correspond to the times of diffusion towards the continuum for wells $Pu_1$ and $Pu_2$.

For the wells of higher indices, the particle flows towards the continuum are no longer significant for they correspond to longer times than the fixed response time $t_R = 250$ ps. As is clear from table 1, time $t_2$ is equal to 525 ps. The flow of particles from well $Pu_2$ towards the continuum may then be already disregarded. The times $t_1$ and $t_2$ and more generally the times $t_n$, although not shown in table 1, correspond to the inverse of the above described parameters $j\uparrow_n$.

The positions of the energy levels corresponding to the different wells have been shown by horizontal lines. The wells $pu_1$ to $pu_3$ comprise a single energy level. Wells $Pu_4$ and $Pu_5$ comprise two. The zone $Z_2$, considered as a well of infinite thickness, naturally comprises a large number: 16 in the example illustrated.

At a working frequency of 2 GHz, if the response time is effectively obtained, a signal supplied by the diode is reduced to $\tau = e^{-500/250}$, that is 14% of its initial value after a period.

The diagonalization of lattice J gives, in the example illustrated in FIG. 6, a first clear value $\lambda_1 = 1.7$ GHz. Since the number of coupled quantum wells is six:

$$\tau \simeq \frac{e^{-1.7 \times 0.5}}{\sqrt{6}},$$

that is about 17%.

Thus the device obtained by the method of the invention may be used at the frequency of 2 GHz.

The invention is naturally not limited to the embodiments which have just been more explicitly described.

The variants of the method derived from the two variants described also form part of the invention. More particularly a variant of the method is used which consists in making a rough optimization using the second variant of the method, then improving it by comparing, using the general determination method consisting in diagonalizing the above defined lattice J, with solutions corresponding to a less rapid growth of the thicknesses of the successive wells or to other values of the thicknesses of the barriers.

Diagonalization of the lattice $j_n$ may also be replaced by increasing of one of the ratios $(j_n^*/j_{n-1}^*)$, the other parameters remaining constant, and the inverse of $j_n$ still respecting the condition of being less than a given fraction of the required time, increases the overall response time in general.

Finally, although in the description of the invention it has been considered implicitly that the carriers which are multiplied by priority were holes, it is clear that the method applies similarly to applications for which the carriers are electrons.

TABLE 1

| Thickness in number of atomic layers | | Well to well transfer time (in ps) | Diffusion time to the continuum (in ps) |
|---|---|---|---|
| $L_1 = 4$<br>$\Delta_1 = 8$ | $L_1 + \Delta_1 = 12$ | $t_{12} = 15$<br>$t_{21} = 17$ | $t_1 = 150$ |
| $L_2 = 5$<br>$\Delta_2 = 6$ | $L_2 + \Delta_2 = 11$ | $t_{23} = 6$<br>$t_{32} = 6$ | $t_2 = 525$ |
| $L_3 = 6$<br>$\Delta_3 = 6$ | $L_3 + \Delta_2 = 12$ | $t_{34} = 21$<br>$t_{43} = 12$ | |
| $L_4 = 7$<br>$\Delta_4 = 5$ | $L_4 + \Delta_3 = 12$ | $t_{45} = 13$<br>$t_{54} = 15$ | |
| $L_5 = 10$<br>$\Delta_5 = 4$ | $L_5 + \Delta_5 = 14$ | $t_{56} = 91$<br>$t_{65} = 8$ | |

What is claimed is:

1. A process for forming an avalanche photodetector of the type comprising at least one photon absorption region in which carriers are photoinduced, made from a first semiconductor material with narrow prohibited band width, a carrier multiplication region made from a second semiconductor material with wide prohibited band width, and a third intermediate region formed by a lattice of slices of alternating layers of the first and second materials forming a system of coupled quantum wells separated by potential barriers, wherein, with the photodetector and operating conditions therefor being specified comprising a given band discontinuity and local electric field as well as a maximum response time, comprising a sequence of steps for determining said intermediate region comprising a minimum number of slices of alternating layers of varying thicknesses ensuring a response time less than or equal to said maximum response time, said sequence of steps comprising:
   (a) determining the respective thicknesses of the layers made from the first and second semiconductor materials forming said slices of the intermediate region of a system comprising a single quantum well ensuring a minimum intermediate response time of said system;
   (b) comparing this minimum intermediate response time with said maximum response time; and
   (c) conditionally repeating steps (a) and (b) by progressively increasing the number of coupled wells until the response time obtained for a system comprising a given number of coupled quantum wells is less than said maximum response time or until the response time for this system comprising said given number of coupled quantum wells is greater than or equal to the response time for a system comprising a number of coupled wells one less than said given number.

2. A method of forming an avalanche photodetector of the type comprising at least one photon absorption region in which carriers are photoinduced, made from a first semiconductor material with narrow prohibited band width, a carrier multiplication region made from a second semiconductor material with wide prohibited band width, and a third intermediate region formed by a lattice of slices of given layers of the first and second materials forming a system of coupled quantum wells separated by potential barriers; wherein, with the photodetector and operating conditions therefor being specified comprising band discontinuity and a given local electric field as well as a maximum response time, including a determination for said intermediate region comprising a minimum number of slices of alternating layers of varying thicknesses ensuring a response time less than or equal to said maximum response time, said determination comprising:
   (a) determining the thickness of the first layer made from the first material forming a well so that the time for evacuating a carrier trapped in this well to the material of wide prohibited band width is less than half said maximum response time;
   (b) determining the thicknesses of the slices which follow, made respectively from the second material forming a barrier and from the first material forming a well, so that the escape time to the preceding well is less than or equal to a given fraction of the maximum response time, and so that the new well is the thickest possible;
   (c) conditionally repeating step (b) while progressively increasing the number of coupled quantum wells so as to form a structure of coupled quantum wells of increasing thicknesses, said repetition taking place until a determined width of the last well tends towards infinity or until said determined width is not strictly greater than that of the well which precedes it.

3. A method as claimed in claim 2, wherein said fraction of the response time is equal to 20%.

4. A method as claimed in claim 1, wherein said first semiconductor material is Indium-Phosphorous (InP) and said second semiconductor material is Indium-Gallium-Arsenic (InGaAs).

5. A method as claimed in claim 1, wherein said carriers are holes.

6. A method as claimed in claim 1, wherein said carriers are electrons.

* * * * *

UNITED STATES PATENT AND TRADEMARK OFFICE
CERTIFICATE OF CORRECTION

PATENT NO. : 4,722,907

DATED : February 2, 1988

INVENTOR(S) : Thierry Weil, et al.

It is certified that error appears in the above-identified patent and that said Letters Patent is hereby corrected as shown below:

Column 1, line 68, change "palliating" to --which tempers--.

Column 4, line 11, change "ALuminum" to --Aluminum--.

Column 6, line 1, before "may" insert a comma (,).

Column 6, line 61, after "Therefore" insert --$j_n^{\leftarrow}$--.

Column 7, line 34, change "$(\omega_{n-1}$" to --$(L_{n-1}$--.

Column 8, line 44, change "pratice" to --practice--.

Signed and Sealed this

Twenty-fifth Day of April, 1989

Attest:

DONALD J. QUIGG

*Attesting Officer*  *Commissioner of Patents and Trademarks*